(12) United States Patent
Uebner et al.

(10) Patent No.: US 10,800,554 B2
(45) Date of Patent: Oct. 13, 2020

(54) SPACE SYSTEM

(71) Applicant: Airbus Defence and Space GmbH, Taufkirchen (DE)

(72) Inventors: Andreas Uebner, Ottobrunn (DE); Daniel Quabis, Ottobrunn (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 221 days.

(21) Appl. No.: 15/900,290

(22) Filed: Feb. 20, 2018

(65) Prior Publication Data
US 2018/0237169 A1 Aug. 23, 2018

(30) Foreign Application Priority Data
Feb. 21, 2017 (DE) .................. 10 2017 202 751

(51) Int. Cl.
| | |
|---|---|
| B64G 1/42 | (2006.01) |
| B64G 1/44 | (2006.01) |
| B32B 5/24 | (2006.01) |
| B64G 1/52 | (2006.01) |
| H01L 31/041 | (2014.01) |

(Continued)

(52) U.S. Cl.
CPC ............. *B64G 1/443* (2013.01); *B32B 5/022* (2013.01); *B32B 5/24* (2013.01); *B32B 5/26* (2013.01); *B32B 27/06* (2013.01); *B32B 27/12* (2013.01); *B32B 27/281* (2013.01); *B64G 1/226* (2013.01); *B64G 1/52* (2013.01); *F28F 13/185* (2013.01); *F28F 21/02* (2013.01); *F28F 21/089* (2013.01); *H01L 31/041* (2014.12); *H01L 31/0481* (2013.01); *H02S 40/30* (2014.12); *H02S 40/40* (2014.12); *B32B 2260/021* (2013.01); *B32B 2260/046* (2013.01); *B32B 2262/0269* (2013.01); *B32B 2262/103* (2013.01); *B32B 2262/106* (2013.01); *B32B 2307/202* (2013.01); *B32B 2307/206* (2013.01); *B32B 2307/21* (2013.01); *B32B 2605/18* (2013.01); *H05F 3/00* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 4,401,710 A | 8/1983 | Bansemir et al. | |
| 8,872,018 B1 * | 10/2014 | Breen | B64G 1/44 136/251 |

(Continued)

FOREIGN PATENT DOCUMENTS

| | | |
|---|---|---|
| EP | 0060975 B1 | 5/1985 |
| EP | 2034804 A1 | 3/2009 |

(Continued)

OTHER PUBLICATIONS

European Search Report for Application No. 17206366.1 dated Jul. 11, 2018.

Primary Examiner — Richard G Davis
(74) Attorney, Agent, or Firm — Jenkins, Wilson, Taylor & Hunt, P.A.

(57) ABSTRACT

A space system including a layered structure on an outer surface of the space system, the layered structure including a conductive veil or nonwoven comprising conductive fibers, and a non-conductive sheet arranged on a surface of the conductive veil or nonwoven.

11 Claims, 4 Drawing Sheets

500

(51) Int. Cl.

| | |
|---|---|
| *B64G 1/22* | (2006.01) |
| *H01L 31/048* | (2014.01) |
| *H02S 40/30* | (2014.01) |
| *H02S 40/40* | (2014.01) |
| *B32B 5/02* | (2006.01) |
| *B32B 5/26* | (2006.01) |
| *B32B 27/06* | (2006.01) |
| *B32B 27/12* | (2006.01) |
| *B32B 27/28* | (2006.01) |
| *F28F 13/18* | (2006.01) |
| *F28F 21/02* | (2006.01) |
| *F28F 21/08* | (2006.01) |
| *H05F 3/00* | (2006.01) |

(56) References Cited

U.S. PATENT DOCUMENTS

| | | | |
|---|---|---|---|
| 2011/0061709 A1 | 3/2011 | Payan | |
| 2012/0090658 A1* | 4/2012 | Streett | C09D 5/24 |
| | | | 136/244 |
| 2017/0291332 A1* | 10/2017 | Braley | B29C 43/003 |
| 2017/0321020 A1 | 11/2017 | Lutz et al. | |

FOREIGN PATENT DOCUMENTS

| | | | |
|---|---|---|---|
| EP | 2259336 A2 | 12/2010 | |
| EP | 3042760 A1 | 7/2016 | |
| WO | WO 2016/075290 A2 | 5/2016 | |

\* cited by examiner

SPACE SYSTEM

CROSS-REFERENCE TO RELATED APPLICATION

This application claims priority to German Patent Application DE 10 2017 202 751.7, filed Feb. 21, 2017, the entire disclosure of which is incorporated by reference herein.

TECHNICAL FIELD

The present disclosure generally relates to a space system comprising a layered structure on an outer surface of the space system, a method of heating a component of a space system, and a method for reducing electrostatic discharge on an outer surface of a space system.

BACKGROUND

Electrical power supply for space missions is mainly generated by solar power. High efficient multi-junction solar cells are used in a broad range of space applications.

FIG. 1 depicts a schematic cross-sectional side-view of a structure comprising two solar cells as used in the prior art. In this example, the photovoltaic assembly is arranged on a rigid support structure. The solar cells (1) are connected in series by a solar cell interconnector (2) to so-called strings. The interconnector is usually made of metallic materials with good electrical conductivity to reduce the resistivity of the connecting element and increase the power output of the solar array. The interconnector part between the solar cells may be a pure metal without any insulation or it could be insulated by, for example, a polyimide foil.

The photovoltaic assembly, which consists of or comprises solar cells (1), interconnectors (2) and bonded cover glasses (3, 4), is then bonded to a support structure (6), which is, in this example, a rigid support structure. Usually the photovoltaic assembly is bonded to the support structure with silicone adhesives (5). The most common support structures used for space applications consist of a rigid sandwich panel structure with carbon fiber face sheets and an aluminum honeycomb core.

Due to the high electrical conductivity of a carbon fiber face sheet, the panel structure has to be insulated to the photovoltaic assembly with its metallic surfaces in order to prevent the existence of an electrical connection.

A common way to insulate the structure from the photovoltaic assembly is to bond a polyimide film (7) on the carbon fiber face sheet. The photovoltaic assembly is bonded onto the polyimide surface without having an electrical connection to the carbon fibers.

As an alternative to rigid panel structures, semi-rigid or flexible support structures (8) may be used to carry the solar cells, as shown in FIG. 3. These semi-rigid or flexible structures consist of or comprise a thin sheet (20), as shown in FIG. 2, which provides additional surface area to the solar array, without adding a lot of mass. For stiffening of the panel, a frame (22) or rips may be used to carry mechanical loads.

The material of the sheet could be made of a conductive material layer or a non-conductive material. If the sheet consists of or comprises a non-conductive layer, there is no need for an insulation layer between the photovoltaic assembly and the structure. For these materials, the photovoltaic assembly can be bonded directly onto the surface of the semi-rigid or flexible sheet. However, if a non-conductive sheet is used, the rear side of the sheet is also non-conductive and the structure does not fulfill electrostatic discharge requirements concerning the surface conductivity.

For other reasons, such as, for example, mechanical considerations, the structure may consist of or comprise a conductive material. For this type of solar array structure, the same criteria apply concerning the insulation requirement as for the rigid panel structures. To achieve this, flexible sheets might be covered with a layer of polyimide foil.

FIG. 3 shows a schematic cross-sectional side-view of a structure comprising two solar cells (1) connected with an interconnector (2), in which the photovoltaic assembly is arranged on a semi-rigid or flexible support structure (8), including the insulation film (7).

However, there is a need for further improvements of space systems.

SUMMARY

According to a first aspect of the present disclosure there is therefore provided a space system comprising a layered structure on an outer surface of the space system, the layered structure comprising: a conductive veil or nonwoven comprising conductive fibers; and a non-conductive sheet arranged on a surface of the conductive veil or nonwoven.

The non-conductive sheet may hereby be arranged only on a single side of the conductive veil or nonwoven layer.

In some examples, the layered structure may be used on an outer surface of a space shuttle. The non-conductive sheet may hereby be arranged on a surface of the conductive veil or nonwoven which faces away from an inside of the space system. The non-conductive sheet may separate the conductive veil or nonwoven from outer space. The inside of the space system may hereby be defined, for example, by an inner space of the space system, such as, for example, an inner space of a space shuttle.

Embodiments therefore allow for a new setup for space systems, such as, for example, space solar array structure or other structures, in order to achieve a specific electrical surface conductivity on defined surfaces. The structural layout of embodiments of the space system is a composition of a non-conductive sheet, such as a non-conductive fabric, and a conductive veil or nonwoven which may be embedded in a matrix, such as, for example, a resin matrix.

The system may provide an adjustable electrical surface conductance for defined surfaces or surface segments by adding a conductive layer to a non-conductive substrate without affecting the mechanical properties of the structure, which may be beneficial especially for very thin substrates. Furthermore, the setup of the conductive veil or nonwoven may be used for heating the structure or components during long eclipses or deep space missions to prevent extremely low temperatures.

The conductive veil (or nonwoven) may therefore allow for providing an electrically conductive component, in order to, for example, reduce electrostatic discharge on an outer surface of the space system, while, in some examples, adding minimal weight to the overall system.

In some examples of the space system, such as, but not limited to a space system in which a photovoltaic assembly is used, the non-conductive sheet may be arranged on a surface of the conductive veil or nonwoven, whereby the surface of the conductive veil or nonwoven faces towards the photovoltaic assembly. This means that, in some variants, the non-conductive sheet may be sandwiched between the conductive veil (or nonwoven) and the photovoltaic assembly. In variants in which the layered structure is incorporated in a solar system, the conductive veil (or nonwoven), which is separated from the photovoltaic assembly via the non-conductive sheet, may hereby, in use, face towards deep space, whereas the photovoltaic assembly may face towards the sun.

It will be understood that the layered structure may also be implemented in space systems other than a solar space system. In some variants, parts of the space system which are arranged on an outer surface of the space system may be disposed on the layered structure. These parts may, for example, be electric or other components of the space system, such that the layered structure allows for adjusting the electrical surface of the space system. As will be further outlined below, the layered structure, on which the electrical or other component(s) may be arranged, may therefore allow for reducing electrostatic discharge on an outer surface of the space system. The conductive veil (or nonwoven) and the non-conductive sheet may hereby, in some variants, face towards opposite directions.

In some examples, the conductive veil or nonwoven has a sheet resistance of less than 10 Ohm/square, preferably less than 5 Ohm/square, preferably less than 1 Ohm/square, or preferably less than 0.5 Ohm/square. In some examples, the non-conductive sheet exhibits a sheet resistance of more than $10^6$ Ohm/square or higher.

In an embodiment of the space system, the layered structure further comprises a solar cell layer arranged on a surface of the non-conductive sheet facing away from the conductive veil or nonwoven. Embodiments of the space system, which may allow for fulfilling electrostatic discharge requirements and which may further allow for avoiding temperatures below a threshold during a space mission by heating components of the space system via the conductive veil or nonwoven, may be particularly useful for a solar array which may generally be the most exposed equipment on, for example, a satellite.

In a further embodiment of the space system, the conductive fibers of the conductive veil or nonwoven comprise carbon fibers, which exhibit relatively high conductivity and relatively low in-plane stiffness compared to, for example, fabrics with continuous fibers.

In an embodiment of the space system, the conductive fibers are coated with a metal layer. The metal layer may comprise or consist of nickel, copper, a nickel-copper alloy, or other metals. The overall conductivity of the fibers, and hence the conductive veil or nonwoven may be increased.

In a further embodiment of the space system, the conductive veil or nonwoven has an areal density of less than 4 grams per square-meter, preferably less than 2 grams per square-meter. The additional weight due to the layered structure may be reduced, thereby keeping the weight of the space system to a minimum. In some examples, however, the areal density of the conductive veil or nonwoven may be higher, for example above 4 grams per square-meter. It will be understood that the functionality of the conductive veil or nonwoven as a conductive layer as such may not be changed (or at least not significantly changed) if the conductive veil or nonwoven has an areal density of more than, for example, 4 grams per square-meter; however, this may potentially adversely affect the total weight of the system.

In an embodiment of the space system, the non-conductive sheet comprises an aramid fabric embedded in a resin matrix. The aramid fabric provides for comparatively good mechanical properties compared to other fabrics, which may be important especially for the tensile strength of the structure.

In an embodiment, the space system further comprises a heat source thermally coupled to the conductive veil or nonwoven, wherein the space system is configured to conduct heat from the heat source to other parts of the space system via the conductive veil or nonwoven. Certain parts of the space system which may be exposed to very low temperatures during a space mission may thereby be kept above a threshold temperature, which may be predefined dependent on the specific component of the space system.

In a further embodiment of the space system, the layered structure further comprises a covering layer on an outermost surface of the space system, wherein the covering layer is configured to reduce black-body radiant emittance of the layered structure. This may allow for minimizing heat lost via black-body radiant emittance. The covering layer may, for example, be a painting or may be a foil applied to the corresponding part of the surface of the space system.

In an embodiment of the space system, the conductive veil or nonwoven is configured to withdraw an electric charge generated on the outer surface of the space system. For electrostatic discharge requirements, the sheet resistance may need to be smaller than approximately 100 kOhm/square. Given the relatively high electrical conductivity of the conductive veil or nonwoven, electrostatic discharge requirements may be fulfilled without providing any further components. An electric charge generated on the outer surface of the space system may therefore be withdrawn via the conductive veil or nonwoven to avoid an increasing electrostatic charging of the outer surface of the space system.

In a related aspect of the present disclosure, there is provided a method of heating a component of a space system, wherein the component constitutes at least a part of an outer surface of the space system, or wherein the component is thermally coupled to at least the part of the outer surface of the space system, the method comprising: providing the space system according to any one of the embodiments as described herein, wherein the conductive veil or nonwoven is thermally coupled to the component of the space system to be heated; and supplying heat to the component of the space system via the conductive veil or nonwoven.

In a further related aspect of the present disclosure, a method is disclosed for reducing electrostatic discharge on an outer surface of a space system, the method comprising providing the space system according to any of the embodiments as described herein, and withdrawing an electric charge generated on the outer surface of the space system via the conductive veil or nonwoven.

BRIEF DESCRIPTION OF THE DRAWINGS

These and other aspects of the disclosure herein will now be further described, by way of example only, with reference to the accompanying figures, wherein like reference numerals refer to like parts, and in which.

DETAILED DESCRIPTION

Figure 1:
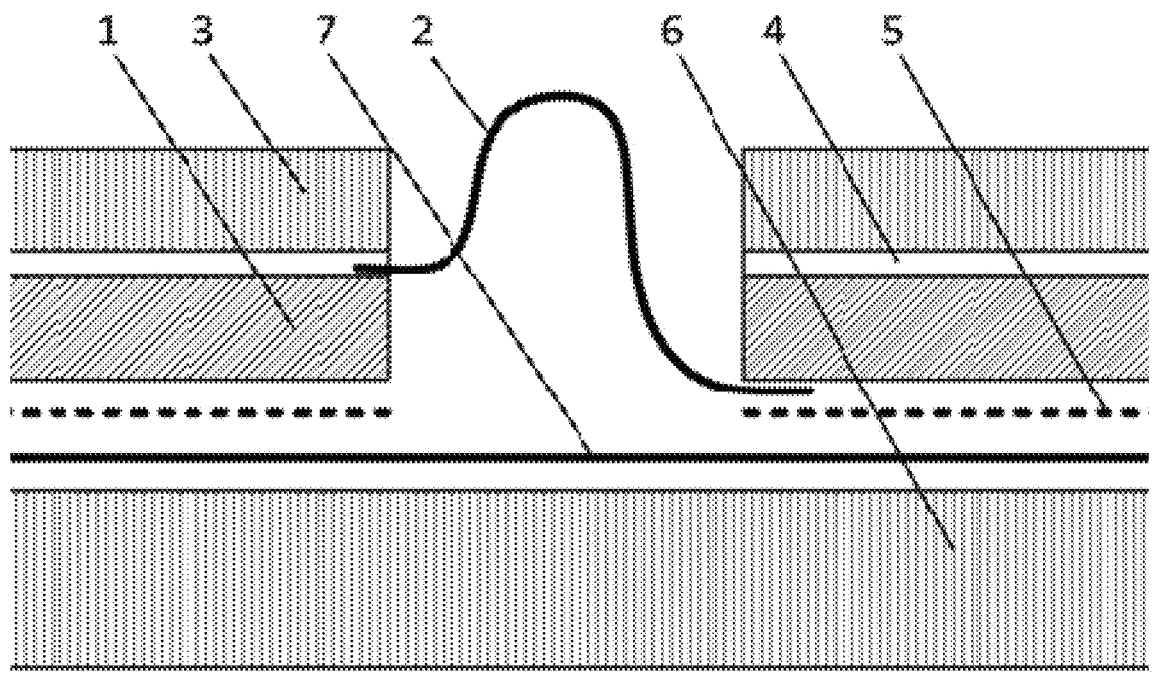
FIG. 1 shows a schematic cross-sectional side-view of two solar cells connected with an interconnector.
Figure 2:
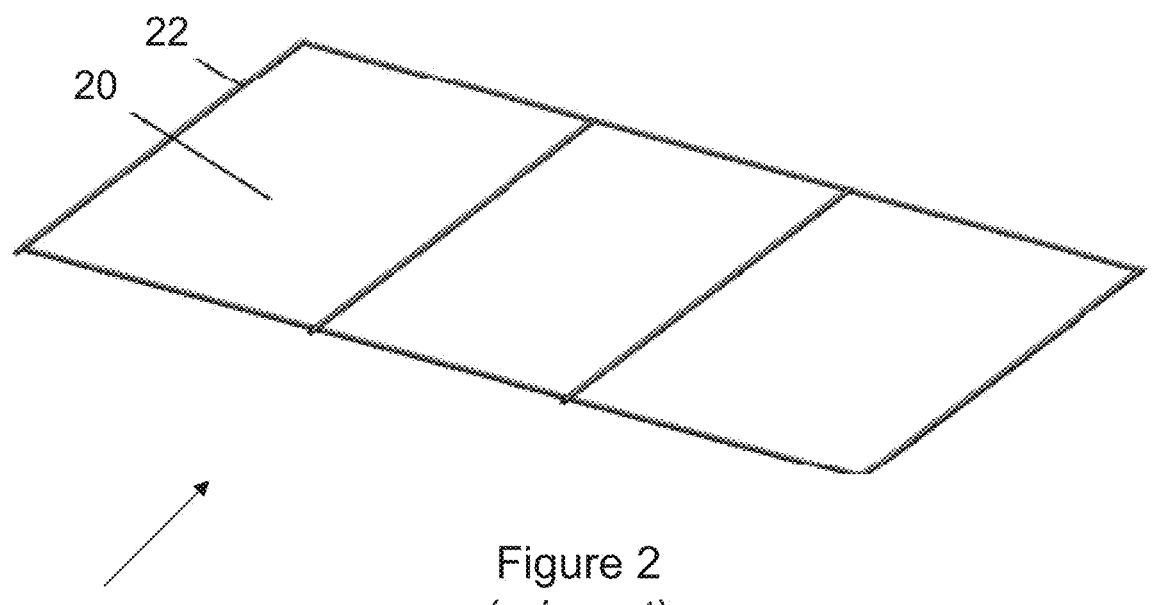
FIG. 2 shows a schematic perspective view of a semi-rigid panel structure.

On the panel rear side without solar cells there is a need for sufficient surface conductivity for any kind of setup to prevent the surface from charging effects by the space environment. Otherwise the surface of the structure may be charged and electrostatic discharge might be the consequence, which may harm the photovoltaic assembly and other components of the solar array, or generally components of the space system.

During operation, the solar array structures may be faced with a strong temperature gradient between the panel side carrying the solar cells to the rear side of the panel which is oriented towards deep space. Due to the large coefficient of thermal expansion of, for example, a polyimide layer, which is usually much higher than for structural materials, thermal deformation may be problematic for the application on thin sheets with a low bending stiffness. Nevertheless for insulation reasons, the insulation layer may be suitable similar to the rigid panels.

The inventors have realized that there is a demand for thin, lightweight structures without having separate insulation layers. Thus, an object of embodiments of the present disclosure is to provide a lightweight structure, which fulfills insulation requirements for the photovoltaic assembly on the solar cell side and electrostatic discharge requirements on the rear side and still shows low thermal deformation even when large temperature gradients are applied.

Another issue realized by the inventors, which can be problematic for very thin structures, is the low thermal mass and also the often high emissivity coefficients, which are useful to emit heat during operation to keep the photovoltaic assembly temperatures low and to increase solar cell efficiency. These two points may lead to a rapid decrease of temperatures if no heat is introduced to the structure while being surrounded by deep space, for example during eclipse.

The mechanical loading due to the low temperatures may be high on structures and electrical components, which may increase cost in the end. Furthermore, this often leads to extremely low qualification environments, which may require very specific test facilities (for example helium-cooled instead of nitrogen-cooled).

Due to modified requirements for the orbiting of the satellites (for example by electric orbit raising), longer eclipses might have a larger focus in the future to arrange an efficient orbiting.

Since the solar array may be the most exposed equipment on the satellite, long eclipse durations etc. may generally be most critical for this specific subsystem. If restrictions coming from the solar array are low, then this may be an advantage for the complete satellite system, as most effective orbiting strategies may be applied, including long eclipses.

Embodiments of the present disclosure may therefore provide a lightweight solar array structure, which may reduce efforts during manufacturing and may provide an insulated surface on one side of the structure and a sufficiently conductive surface on the other side of the structure to fulfil electrostatic discharge requirements by the use of a conductive veil or nonwoven. The use of the conductive veil or nonwoven may further provide for a uniform conductance across the entire surface structure.

The conductive veil or nonwoven may also be used as a heater or heat conductor to prevent the structures or components from exhibiting extremely low temperatures, as are present in space. These properties may be achieved on the solar array structures by the use of a conductive veil or nonwoven (for example comprising or consisting of carbon).

As outlined above, embodiments may therefore allow for using a conductive veil or nonwoven in order to achieve electrostatic discharge requirements on the non-solar cell panel side. Furthermore, embodiments may allow for using the conductive veil or nonwoven as a heating element or heat conductor to avoid temperatures on, in particular, low-mass structures or dedicated components of the space system falling below a predefined threshold.

Figure 4:
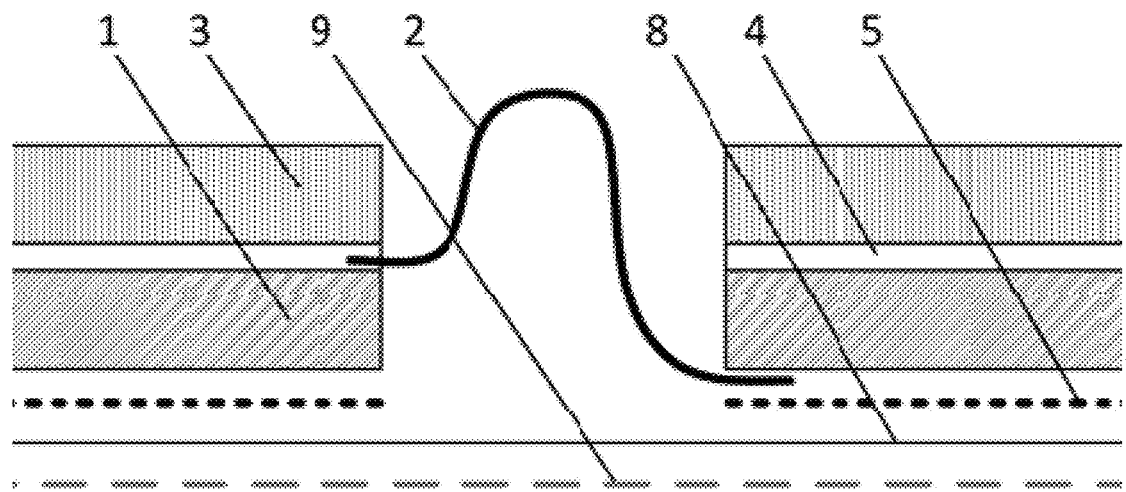
FIG. 4 shows a schematic cross-sectional side-view of two solar cells connected with an interconnector according to embodiments of the present disclosure.

FIG. 4 shows a schematic cross-sectional side-view of a structure as described herein.

In this example, two solar cells (1) are connected with an interconnector (2) on a semi-rigid or flexible support structure with a carbon veil (9).

The structure comprises a structural component made of a non-conductive sheet, in this example an aramid fabric, in combination with a resin matrix (8), which is then combined with a veil made of conductive fibers (9), in this example carbon fibers.

Figure 3:
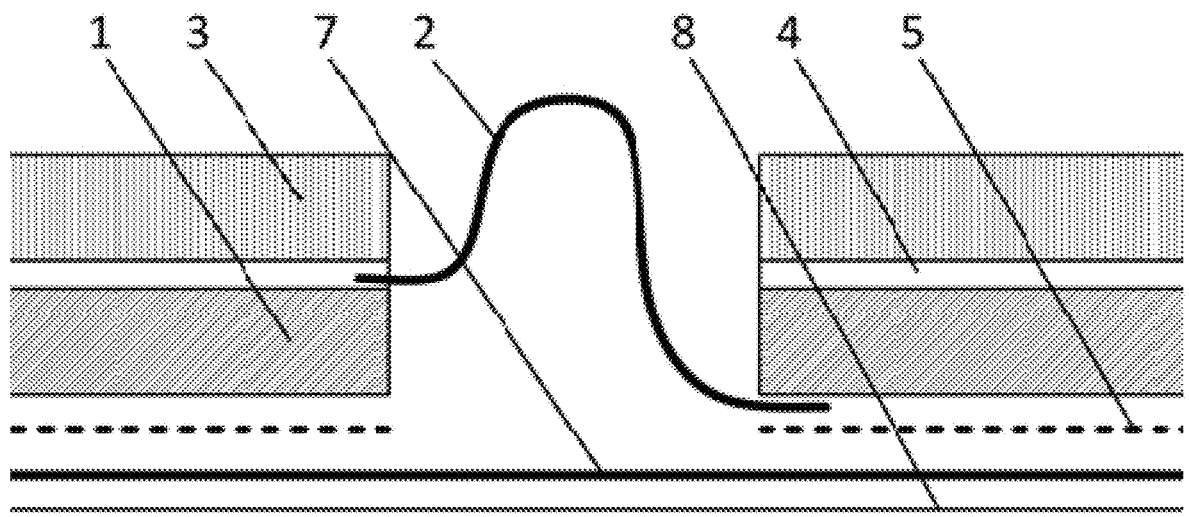
FIG. 3 shows a schematic cross-sectional side-view of two solar cells connected with an interconnector.

The photovoltaic assembly (1, 2, 3, 4, 5) is, in this example, identical to the common technology as shown in FIG. 3.

With the use of separate thin insulation films with a conductive sheet material, there is a possibility of a short circuit if the foil is damaged and carbon fibers contact the surface. For the additional insulation layer, polyimide is a widely used material, for example in a layer thickness of about 50 μm on the panel surface. The polyimide has a coefficient of thermal expansion of $17\text{-}32\times10^{-6}$ $K^{-1}$ for a temperature range between 30-200° C. Since the coefficient of thermal expansion of carbon fiber structures ranges around zero, large thermal stresses may be introduced into the structure and may create a bi-metallic effect leading to large deformations of large structures. This effect may be observed already during manufacturing if higher temperatures are used for curing or bonding.

By using a non-conductive sheet material as the structural element, the insulation effect is already included within the structure without adding any other components such as a polyimide film. With this setup, it is excluded that a short circuit between the structure and the photovoltaic assembly can occur. Embodiments of the structure described herein use on the sheet side without solar cells the conductive veil, for example a carbon veil, to prevent any charging by the space environment as the structure with the veil is connected to the grounding system of the satellite. The carbon veil is physically separated from the non-conductive side by the aramid layer. The carbon veil has very low in-plane stiffness, since it is a nonwoven structure, compared to typical fabrics with continuous fibers. As a result, the mechanical properties of the structure may be dominated by the non-conductive aramid fabric and the veil may have very low influence on, for example, thermal deformation etc.

Nevertheless, in principle the carbon veil may also be applied on structures which consist of or comprise a non-conductive fabric with, for example, a polyimide film on the solar cell side. This could be the reason if, for example, a redundant insulation is required between the photovoltaic assembly and the structure. Effects like thermal deformation may need to be taken into account.

By using the conductive veil or nonwoven, the surface of the rear side of this sheet has sufficient conductivity to prevent the surface from an electrical charging by the space environment and fulfilling defined electrostatic discharge requirements. Using this material composition, the risk of electrostatic discharge may be significantly reduced with only adding very low weight to the structure. The conductivity values can be influenced by the use of different veils or nonwoven in terms of aerial weight.

For electrostatic discharge requirements, a sheet resistance of smaller than approximately 100 kOhm/square is usually required. To add only a small amount of material, the veil or nonwoven may result in improved properties in terms of high electrically conductivity. Therefore, a veil of carbon fibers may be the preferred material for this application. For improved performance, the carbon fibers may be coated with nickel, copper or a copper-nickel alloy, to thereby increase the conductivity of the structure.

If the carbon veil is added to the structure, this may affect the mass of the laminate. The mass of the carbon veil is added to the structure, but also more resin may be needed to fill not only the volume of the non-conductive layer but also the volume of the veil. In order to reduce the additional weight of the structure, the optimal veil should be lightweight and thin in thickness. In some examples, the carbon veil (or nonwoven) therefore exhibits an aerial weight of 4 $g/m^2$, or preferably 2 $g/m^2$, and a thickness of 0.05 mm, or preferably 0.03 mm.

In this configuration, the material may have very low in-plane stiffness and very low tensile strength below 10 MPa. But since the material may not be used as a structural material, strength may not be a key requirement. Nevertheless, the strength of the veil may be sufficient for handling without special care, which may be important for efficient manufacturing.

Aramid fabrics are non-conductive and exhibit good mechanical properties especially for tensile strength. For example, aramid fabric with an aerial weight of 63 $g/m^2$ and a thickness of 0.07 mm provides sufficient support to withstand the mechanical loads of a semi-rigid panel. By combining the aramid fabric with the carbon veil, the laminate thickness may be around 0.1 mm.

Table 1 shows typical properties of carbon fibers, such as M55J from Torayca®, and aramid fibers.

TABLE 1

Properties of aramid fibers and carbon fibers.

| Fiber material | Coefficient of thermal expansion [1/K] | Young's modulus [GPa] | Tensile strength [MPa] |
|---|---|---|---|
| Aramid fiber | $-3.5 \times 10^{-6}$ | 100 | 2880 |
| Carbon fiber (e.g. M55J) | $-1.1 \times 10^{-6}$ | 540 | 4020 |

Figure 5:
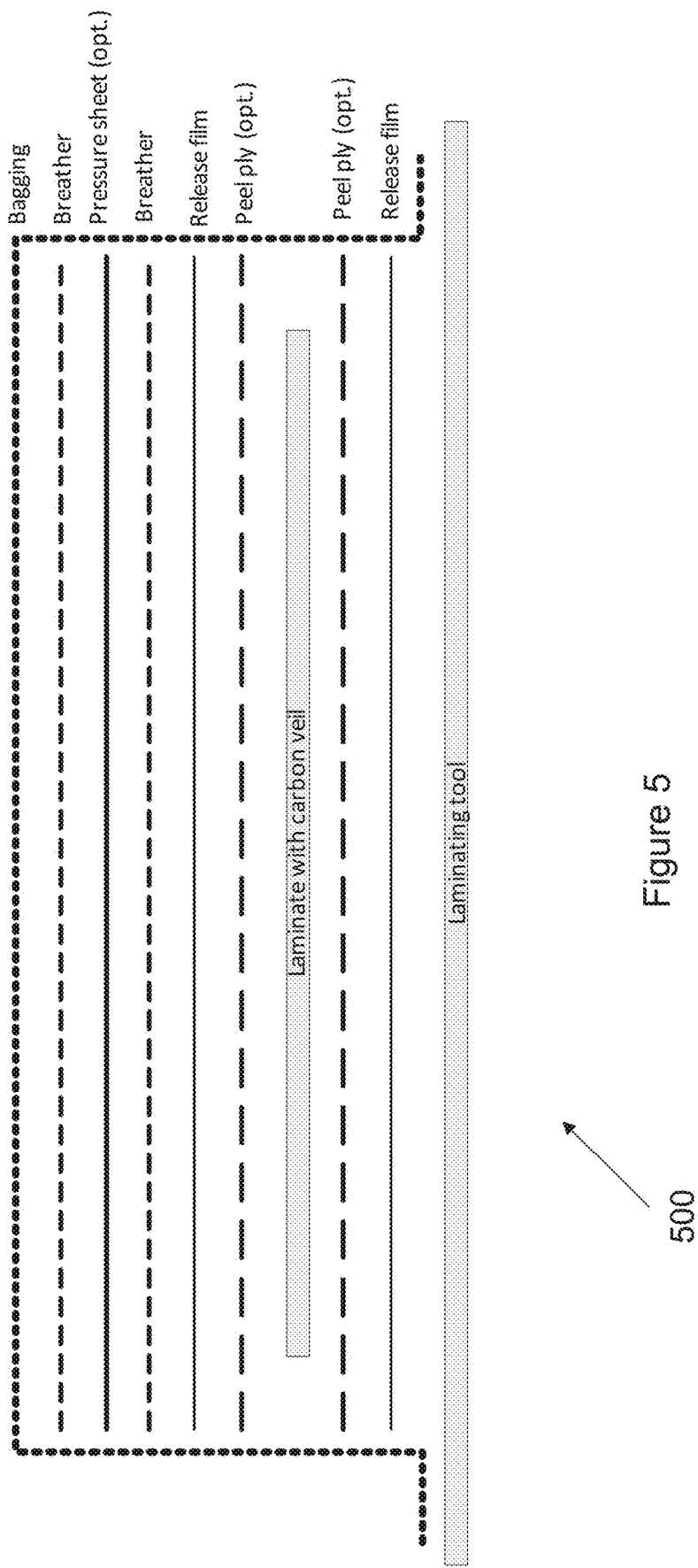
FIG. 5 shows a schematic illustration of a setup for curing of thin laminates.

FIG. 5 shows a schematic illustration of a setup for curing of thin laminates.

In this example, a laminating tool is provided. The multilayer structure comprises of a release film into which an optional peel ply may be arranged. The laminate with the carbon veil is then placed on top of the (optional) peel ply. Another (optional) peel ply is then deposited onto the laminate with the carbon veil, followed by a release film, a breather, an (optional) pressure sheet and another breather. The structure is then covered by a vacuum bag.

The laminates may be built with standard manufacturing techniques for composite parts, such as manual or automated impregnation of fabrics or the application onto prepreg systems (as seen in FIG. 5). The carbon veil is, in this example, applied on the uncured resin and is typically co-cured with the product. For the semi-rigid structure, well-known resin types may be used, such as space graded aerospace epoxy resins. No additional adhesive is required for bonding.

With these techniques, light weight laminates with aerial weights in the range of 120 gsm to 160 gsm may be realized with good mechanical properties, integrated insulation and fulfilling the requirements concerning electrostatic discharge. Tensile properties are identical with standard laminates of aramid fabrics embedded in a resin matrix.

Table 2 shows measurement results for a laminate which has been manufactured with manual impregnation of an aramid fabric having 63 gsm aerial weight embedded into an epoxy resin matrix.

TABLE 2

Conductivity measurements for laminates with a carbon veil only on one side.

| Measurement point | Sheet resistance carbon veil side [kOhm/square] | Sheet resistance aramid side [kOhm/square] |
|---|---|---|
| MP1 | 0.180 | Non-conductive |
| MP2 | 0.190 | Non-conductive |
| MP3 | 0.130 | Non-conductive |
| MP4 | 0.100 | Non-conductive |
| MP5 | 0.380 | Non-conductive |
| MP6 | 0.250 | Non-conductive |
| MP7 | 0.130 | Non-conductive |
| MP8 | 0.190 | Non-conductive |
| MP9 | 0.220 | Non-conductive |

A carbon veil without surface metallization with an aerial weight of 4 gsm was applied to the laminate and co-cured with the laminate. The cured laminate showed an average measurement value on the side with carbon veil of 0.197 kOhm/square with a standard deviation of 0.083 kOhm/square. The insulation on the non-carbon veil side was given for all measurement points across the laminate. The aerial weight of the laminate was 121 gsm.

As outlined above, in embodiments described herein, the conductive veil (which may be a carbon veil) or nonwoven is used as a heating element for the sheet or panel structure or for specific components (for example electrical, electronic and electro-mechanical (EEE) parts) of the space system.

Figure 6:
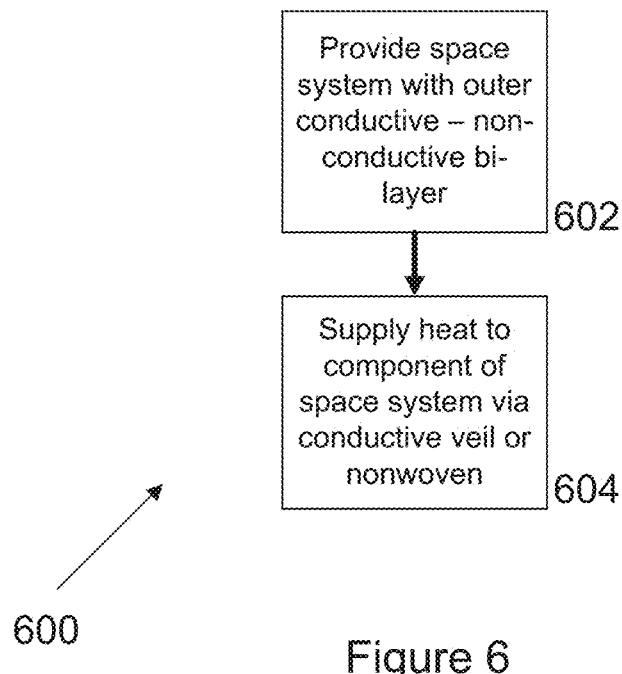
FIG. 6 shows a flow chart of a method of heating a component of a space system according to embodiments of the present disclosure.

FIG. 6 depicts a flow chart 600 of a method of heating a component of a space system according to embodiments of the present disclosure. As shown, a space system generally as described herein is provided in step 602. Heat is then supplied in step 604 to a component of the space system via the conductive veil or nonwoven. The conductive veil or nonwoven thereby serves as a heat conductor which is thermally coupled to the component to be heated.

The component that is heated via the conductive veil or nonwoven may be at least a part of the outer surface of the space system. It may then be particularly important to heat the component which is exposed to very low temperatures in space. The component which may be heated may alternatively not be arranged on the outer surface of the space system, but may be in thermal contact with another part of the space system which is arranged on the outer surface of the space system, and which is therefore exposed to very low temperatures in space. The part of the system arranged on the outer surface of the space system may therefore be heated via the conductive veil or nonwoven and further via the component which is thermally coupled to the conductive veil or nonwoven. A heat transfer path between the heat source and the part to be heated may thereby be established via a "heat source—conductive veil or nonwoven-component—part on outer surface of space system" heat transfer path.

It may be important for the flexible or semi-rigid structures to exhibit low own weight. This may be required in order to not create large mechanical weight caused by the mass during launch and deployment of the space system. This means that the temperatures of these structures may drop rapidly as soon as no heat flow is received, for example during eclipse.

Many space systems, for example satellite applications, involve long eclipses, for example during transfer with electric orbit raising. This may lead to huge qualification effort for structures and components, since very low temperatures cannot be easily tested anymore in test chambers with nitrogen, but with helium etc. instead. In the end, more effort may have to be put into the qualification, which may result in increased costs.

During eclipse, the structure may not absorb any energy from, for example, the sun, but may emit energy into deep space, which may lead to low temperatures.

The heat flow, which is emitted from the structure into deep space, can be approximated with the following formula:

$$q = \varepsilon * \sigma * T^4$$

where q is the heat transfer per unit area, $\varepsilon$ is the emissivity of the structure, $\sigma$ is the Stefan-Boltzmann constant ($5.67 \times 10^{-8}$ W/m$^2$K$^4$), and T is the temperature of the structure in Kelvin.

In embodiments, the structures may be heated with the use of the conductive veil or nonwoven, whereby heat is applied on the rear side of the non-conductive structure. A constant heat flow may thereby be introduced into the structure to compensate the heat flow, which is emitted into deep space, and to keep the structure at a dedicated temperature level.

A structure with $\varepsilon=0.90$ and T=98 K can be taken as an example. The heat flow results in about q=4.71 W/m$^2$. This means that 4.71 W/m$^2$ and further power losses have to be introduced by heating to keep the temperature level.

The emissivity has a linear impact on the amount of heat and is between 0.90 and 0.95 for structures with a black, carbon loaded resin matrix. This value may be reduced significantly by improving surface appearance, for example by painting, application of a foil etc.

In a solar array structure, power of the solar array may be transferred to the satellite batteries and consumers. No power supply of the solar array is generally necessary.

For this application, the satellite may need to have a battery system with a power supply for the heating, which may be charged during operational mode and may supply the heaters during eclipse. The power budget may need to be over-dimensioned during operation to cover also the needs during eclipse.

When heating large solar array structures, large amount of power may be necessary. Depending on the mission and the power budget, it may need to be evaluated, whether the systems and methods described herein should be applied. Nevertheless, the embodiments described herein may be applied for dedicated areas on the solar array, respectively locations with dedicated components (for example electric parts with temperature limits), which should be heated such that they do not fall below predefined temperature limits. Only small dedicated areas with, for example, electronic parts may hereby be heated in embodiments, instead of re-qualifying these components to extreme temperatures.

Figure 7:
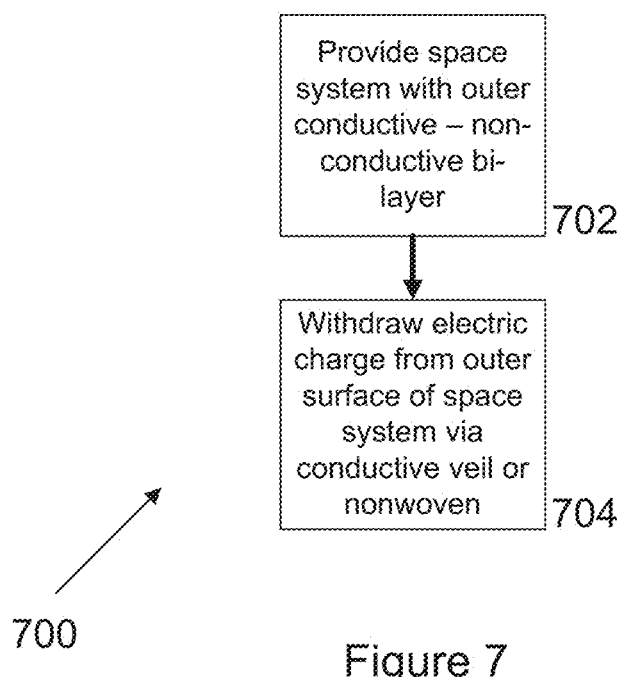
FIG. 7 shows a flow chart of a method for reducing electrostatic discharge on an outer surface of a space system according to embodiments of the present disclosure.

FIG. 7 shows a flow chart of a method for reducing electrostatic discharge on an outer surface of a space system according to embodiments of the present disclosure.

A space system with a conductive veil or nonwoven-non-conductive layer as outlined throughout the present disclosure is provided in step 702. As outlined above, and as shown in step 704, electric charges may then be withdrawn from the outer surface of the space system via the conductive veil or nonwoven.

Embodiments described herein are suited especially for space solar array structures, but can be applied to any space structures and systems, which may require the specific properties and features of the structure outlined throughout the present disclosure.

No doubt many other effective alternatives will occur to the skilled person. It will be understood that the disclosure herein is not limited to the described embodiments and encompasses modifications apparent to those skilled in the art and lying within the scope of the claims appended hereto.

While at least one exemplary embodiment of the present disclosure herein(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A space system comprising:
   a layered structure on an outer surface of the space system, the layered structure comprising:
   a conductive veil or nonwoven comprising conductive fibers; and
   a non-conductive sheet arranged on a surface of the conductive veil or nonwoven; and
   a heat source thermally coupled to the conductive veil or nonwoven, and wherein the space system is configured to conduct heat from the heat source to other parts of the space system via the conductive veil or nonwoven.

2. The space system as claimed in claim 1, wherein the layered structure further comprises a solar cell layer arranged on a surface of the non-conductive sheet facing away from the conductive veil or nonwoven.

3. The space system as claimed in claim 1, wherein the conductive fibers comprise carbon fibers.

4. The space system as claimed in claim 1, wherein the conductive fibers are coated with a metal layer.

5. The space system as claimed in claim 1, wherein the conductive veil or nonwoven has an areal density of less than 4 grams per square-meter.

6. The space system as claimed in claim 1, wherein the non-conductive sheet comprises an aramid fabric embedded in a matrix.

7. The space system as claimed in claim 1, wherein the conductive veil or nonwoven has an areal density of less than 2 grams per square-meter.

8. The space system as claimed in claim 1, wherein the layered structure further comprises a covering layer on an outermost surface of the space system, and wherein the covering layer is configured to reduce black-body radiant emittance of the layered structure.

9. The space system as claimed in claim 1, wherein the conductive veil or nonwoven is configured to withdraw an electric charge generated on the outer surface of the space system.

10. A method of heating a component of a space system, the method comprising:
providing the space system, which comprises a layered structure on an outer surface of the space system, the layered structure comprising:
a conductive veil or nonwoven comprising conductive fibers; and
a non-conductive sheet arranged on a surface of the conductive veil or nonwoven;
wherein the conductive veil or nonwoven is thermally coupled to the component of the space system to be heated;
thermally coupling a heat source to the conductive veil or nonwoven;
supplying heat to the component of the space system via the conductive veil or nonwoven; and
conducting heat from the heat source to other parts of the space system via the conductive veil or nonwoven;
wherein the component constitutes at least a part of the outer surface of the space system and/or is thermally coupled to at least the part of the outer surface of the space system.

11. A method for reducing electrostatic discharge on an outer surface of a space system, the method comprising:
providing the space system, which comprises a layered structure on an outer surface of the space system, the layered structure comprising:
a conductive veil or nonwoven comprising conductive fibers; and
a non-conductive sheet arranged on a surface of the conductive veil or nonwoven;
thermally coupling a heat source to the conductive veil or nonwoven;
conducting heat from the heat source to other parts of the space system via the conductive veil or nonwoven; and
withdrawing an electric charge generated on the outer surface of the space system via the conductive veil or nonwoven.

* * * * *